(12) United States Patent
Yamada et al.

(10) Patent No.: US 11,031,532 B2
(45) Date of Patent: Jun. 8, 2021

(54) LIGHT EMITTING DEVICE

(71) Applicant: NICHIA CORPORATION, Anan (JP)

(72) Inventors: Motokazu Yamada, Tokushima (JP); Yuichi Yamada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/019,352

(22) Filed: Sep. 14, 2020

(65) Prior Publication Data

US 2020/0411737 A1    Dec. 31, 2020

Related U.S. Application Data

(60) Continuation of application No. 16/017,953, filed on Jun. 25, 2018, now Pat. No. 10,847,688, which is a
(Continued)

(30) Foreign Application Priority Data

Dec. 26, 2014 (JP) .................. 2014-266765
Feb. 12, 2015 (JP) .................. 2015-025503
Jun. 26, 2015 (JP) .................. 2015-128516

(51) Int. Cl.
*H01L 33/54* (2010.01)
*H01L 33/50* (2010.01)

(52) U.S. Cl.
CPC ............ *H01L 33/54* (2013.01); *H01L 33/508* (2013.01); *H01L 2224/16225* (2013.01);
(Continued)

(58) Field of Classification Search
None
See application file for complete search history.

(56) References Cited

U.S. PATENT DOCUMENTS

| 8,558,456 B2 | 10/2013 | Yokotani |
| 2006/0071325 A1 | 4/2006 | Tanaka |

(Continued)

FOREIGN PATENT DOCUMENTS

| EP | 2293354 | 3/2011 |
| JP | 2002-531956 | 9/2002 |

(Continued)

OTHER PUBLICATIONS

Office Action with Form PTO-892 Notice of References Cited issued by the U.S. Patent and Trademark Office for the U.S. Appl. No. 14/968,897, dated Mar. 27, 2017.
(Continued)

*Primary Examiner* — Ali Naraghi
(74) *Attorney, Agent, or Firm* — Mori & Ward, LLP

(57) ABSTRACT

A light emitting device includes at least one LED package, and at least one light transmissive sealing member. Each of the at least one LED package includes a light emitting element, a wavelength converter, and a reflection member. The light emitting element is mounted on a mounting surface of a base and electrically connected to a conductor wiring. The wavelength converter is provided on an upper surface of the light emitting element. The reflection member covers a side surface and a lower surface of the light emitting element. Each of the at least one light transmissive sealing member includes a light diffusion material and covers each of the at least one LED package. Each of the at least one light transmissive sealing member has a projection shape with a substantially circular bottom surface facing the base and with a height in the light axis direction of the light emitting element.

20 Claims, 7 Drawing Sheets

Related U.S. Application Data division of application No. 14/968,897, filed on Dec. 15, 2015, now Pat. No. 10,032,969.

(52) U.S. Cl.
CPC .............. *H01L 2224/32225* (2013.01); *H01L 2224/73204* (2013.01); *H01L 2924/181* (2013.01)

(56) References Cited

U.S. PATENT DOCUMENTS

| | | |
|---|---|---|
| 2006/0102914 A1 | 5/2006 | Smits et al. |
| 2006/0105484 A1 | 5/2006 | Basin et al. |
| 2007/0075306 A1 | 4/2007 | Hayashi et al. |
| 2008/0076198 A1 | 3/2008 | Park et al. |
| 2009/0058256 A1 | 3/2009 | Mitsuishi et al. |
| 2009/0135581 A1* | 5/2009 | Yano ................ H01L 33/44 362/84 |
| 2009/0231833 A1* | 9/2009 | Miki ................ H01L 33/505 362/84 |
| 2010/0244071 A1 | 9/2010 | Wada et al. |
| 2010/0259706 A1 | 10/2010 | Kuwaharada et al. |
| 2011/0057226 A1 | 3/2011 | Oberleither et al. |
| 2012/0113621 A1 | 5/2012 | Lee et al. |
| 2012/0120118 A1 | 5/2012 | Chan et al. |
| 2012/0211774 A1* | 8/2012 | Harada ................ H01L 33/56 257/88 |
| 2012/0274203 A1 | 11/2012 | Yokotani |
| 2012/0275150 A1 | 11/2012 | Yokotani et al. |
| 2013/0141920 A1 | 6/2013 | Emerson et al. |
| 2014/0043831 A1 | 2/2014 | Yoon et al. |
| 2014/0054622 A1 | 2/2014 | Park |
| 2014/0209943 A1* | 7/2014 | Yamamoto .............. H01L 27/15 257/89 |
| 2014/0226345 A1* | 8/2014 | Song ................ H01L 33/62 362/382 |
| 2017/0254505 A1 | 9/2017 | Lv et al. |

FOREIGN PATENT DOCUMENTS

| | | |
|---|---|---|
| JP | 2004-266148 | 9/2004 |
| JP | 2006-114863 | 4/2006 |
| JP | 2006-148147 | 6/2006 |
| JP | 2007-148332 | 6/2007 |
| JP | 2008-078659 | 4/2008 |
| JP | 2009-059896 | 3/2009 |
| JP | 2010-278246 | 12/2010 |
| JP | 2011-138815 | 7/2011 |
| JP | 2012-195420 | 10/2012 |
| JP | 2012-231036 | 11/2012 |
| JP | 2012-234906 | 11/2012 |
| WO | WO 00/33390 | 6/2000 |
| WO | WO 2005/067066 | 7/2005 |
| WO | WO 2009/145298 | 12/2009 |
| WO | WO 2009/157166 | 12/2009 |

OTHER PUBLICATIONS

Office Action with Form PTO-892 Notice of References Cited issued by the U.S. Patent and Trademark Office for the U.S. Appl. No. 14/968,897, dated Nov. 1, 2017.

Advisory Action issued by the U.S. Patent and Trademark Office for the U.S. Appl. No. 14/968,897, dated Feb. 5, 2018.

Notice of Allowance issued by the United States Patent and Trademark Office for the U.S. Appl. No. 14/968,897, dated Mar. 26, 2018.

Office Action with Form PTO-892 Notice of References Cited issued by the U.S. Patent and Trademark Office for the U.S. Appl. No. 16/017,953, dated Jun. 25, 2019.

Office Action with Form PTO-892 Notice of References Cited issued by the U.S. Patent and Trademark Office for the U.S. Appl. No. 16/017,953, dated Feb. 5, 2020.

Advisory Action issued by the U.S. Patent and Trademark Office for the parent U.S. Appl. No. 16/017,953, dated May 15, 2020.

Notice of Allowance with Form PTO-892 Notice of References Cited issued by the United States Patent and Trademark Office for the parent U.S. Appl. No. 16/017,953, dated Jun. 17, 2020.

* cited by examiner

LIGHT EMITTING DEVICE

CROSS-REFERENCE TO RELATED APPLICATIONS

The present application is a continuation application of the U.S. patent application Ser. No. 16/017,953 filed Jun. 25, 2018, which is a divisional application of the U.S. patent application Ser. No. 14/968,897 filed Dec. 15, 2015, which was issued as the U.S. Pat. No. 10,032,969, which claims priority under 35 U.S.C. § 119 to Japanese Patent Application No. 2014-266765, filed Dec. 26, 2014, Japanese Patent Application No. 2015-025503, filed Feb. 12, 2015, and Japanese Patent Application No. 2015-128516, filed Jun. 26, 2015. The contents of these applications are incorporated herein by reference in their entirety.

BACKGROUND

Technical Field

The present disclosure relates to a light emitting device.

Discussion of the Background

Recently, various kinds of electronic components have been put into practical use, and high performance has been required in these components. Especially, the electronic component is required to maintain performance for a long period of time under a severe usage environment. This requirement is also applied to a light emitting device using a semiconductor light emitting element such as a light emitting diode (LED). That is, the performance required in the light emitting device is getting improved in a general lighting field and a car-mounted lighting field, and a higher output (higher brightness) and higher reliability are required. Furthermore, low-price supply is also required while the high performance is maintained.

Especially, as for a backlight used in a liquid crystal television and a general lighting device, an excellent design is emphasized, and a thickness is required to be reduced.

For example, Japanese Unexamined Patent Application Publication No. 2006-114863 discloses a light emitting diode in which bat-wing shaped light distribution characteristics are realized by combining a secondary optical lens and the LED, and a light can be uniformly diffused in a short irradiation distance, so that a device can be reduced in thickness.

In addition, Japanese Unexamined Patent Application Publication No. 2012-231036 discloses a light emitting diode in which bat-wing shaped light distribution characteristics are realized by use of a molded shape.

SUMMARY

According to a first aspect of the present invention, a light emitting device includes a base, at least one LED package, and at least one light transmissive sealing member. The base has a mounting surface with a conductor wiring. Each of the at least one LED package includes a light emitting element, a wavelength converter, and a reflection member. The light emitting element is mounted on the mounting surface of the base and electrically connected to the conductor wiring. The light emitting element has a light axis direction substantially perpendicular to the mounting surface. The light emitting element has a lower surface facing the base, an upper surface opposite to the lower surface, and a side surface connecting the lower surface and the upper surface. The wavelength converter is provided on the upper surface of the light emitting element. The reflection member covers the side surface and the lower surface of the light emitting element. Each of the at least one light transmissive sealing member includes a light diffusion material and covers each of the at least one LED package. Each of the at least one light transmissive sealing member has a projection shape with a substantially circular bottom surface facing the base and with a height in the light axis direction of the light emitting element.

According to a second aspect of the present invention, a light emitting device includes a base, at least one LED package, and at least one light transmissive sealing member. The base has a mounting surface with a conductor wiring. Each of the at least one LED package includes a light emitting element, a wavelength converter, and a reflection member. The light emitting element is mounted on the mounting surface of the base and electrically connected to the conductor wiring. The light emitting element has a light axis direction substantially perpendicular to the mounting surface. The light emitting element has a lower surface facing the base, an upper surface opposite to the lower surface, and a side surface connecting the lower surface and the upper surface. The wavelength converter is provided on the upper surface of light emitting element. The reflection member covers the side surface and the lower surface of the light emitting element. Each of the at least one light transmissive sealing member includes a light diffusion material and covers each of the at least one LED package. Each of the at least one light transmissive sealing member has a projection shape with a substantially ellipsoidal bottom surface facing the base and a height in a light axis direction of the at least one light emitting element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
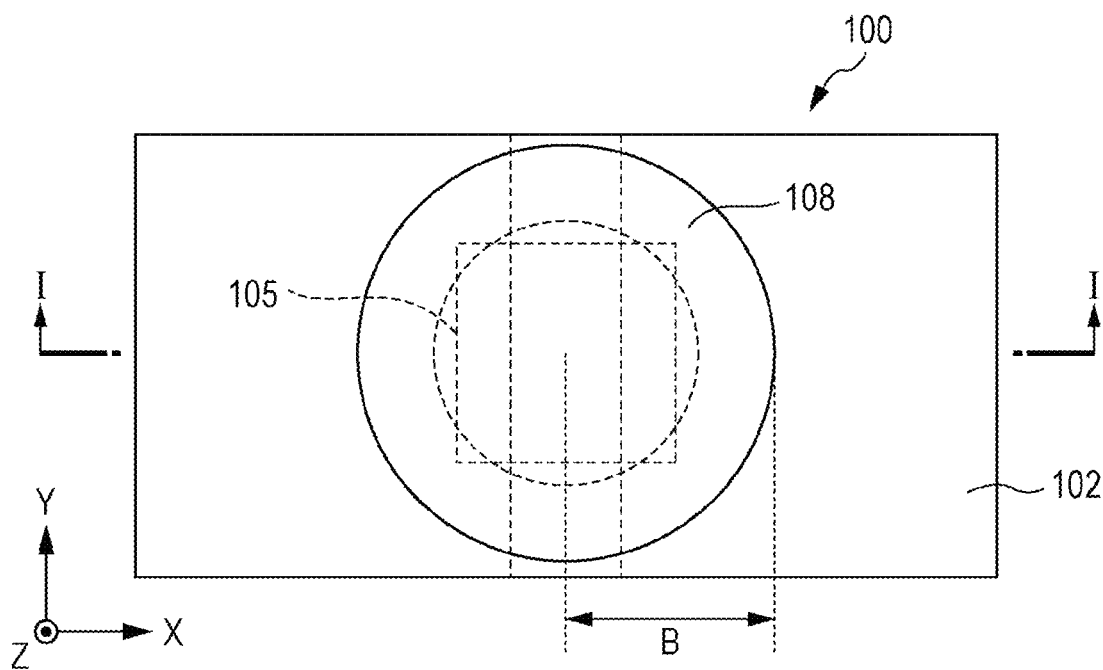
FIGS. 1A and 1B are a top view and a cross-sectional view showing one example of a light emitting device in an embodiment, respectively.

The embodiments will now be described with reference to the accompanying drawings, wherein like reference numerals designate corresponding or identical elements throughout the various drawings.

Hereinafter, the embodiments of the present invention will be described with reference to the drawings. However, light emitting devices which will be described below are only provided to specify a technical idea, and the embodiments of the present invention is not limited to the following light emitting devices unless otherwise stated. In addition, the contents described in one embodiment and one example may be applied to another embodiment and another example.

Furthermore, in the following description, the same name or the same reference represents the same or similar member, so that a detailed description is appropriately omitted. In addition, as for each component in the embodiments of the present invention, a plurality of components may be composed of the same member and one member may serve as the plurality of components, or a function of one member may be shared with a plurality of members.

First Embodiment

Figure 1B:
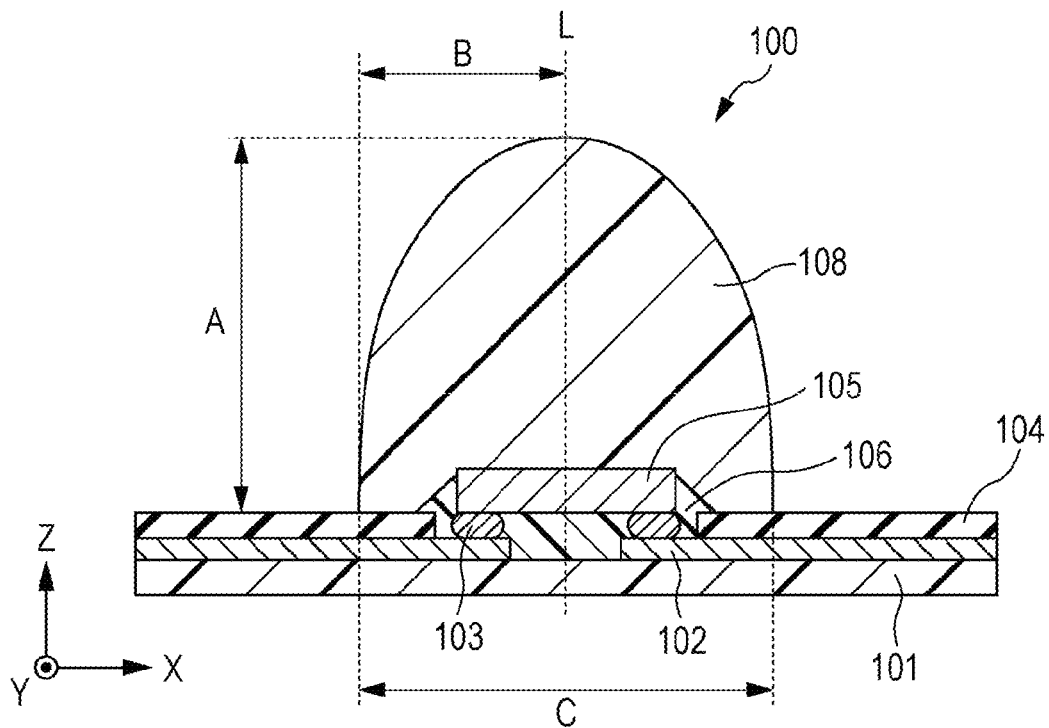

FIGS. 1A and 1B are schematic structure diagrams showing one example of a light emitting device in the first embodiment, in which FIG. 1A is a top view, and FIG. 1B is a cross-sectional view taken along a line I-I in FIG. 1A.

As shown in FIGS. 1A and 1B, in this embodiment, a light emitting element 105 is mounted on a base member 101 by flip-chip bonding so as to be connected to a pair of conductor wirings 102 provided on a surface of the base member through a connection member 103. An upper surface of the conductor wiring 102 is partially electrically connected to the light emitting element 105, and this portion is exposed from an insulating member 104.

An underfill 106 is formed under the light emitting element 105 (between a lower surface of the light emitting element 105 and the base member 101) and around the light emitting element 105, and a sealing member 108 containing a light diffusion material is formed on the light emitting element 105.

Figure 2:
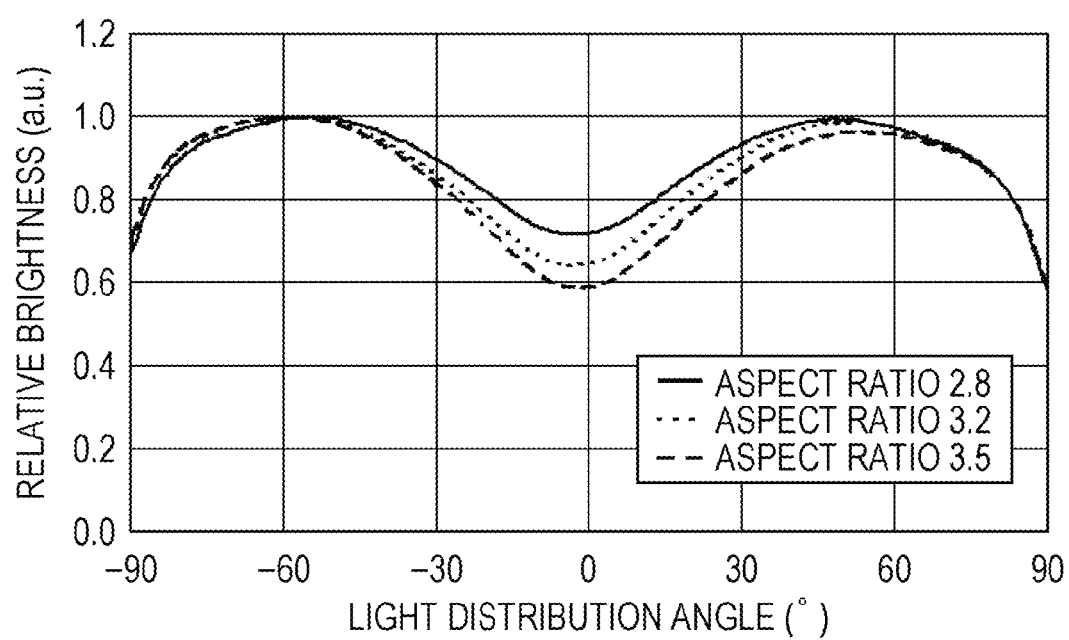
FIG. 2 is a view showing a light distribution characteristic of the light emitting device in the embodiment.

The sealing member 108 has a projection shape (including roughly long semi-spherical shape, roughly circular cone shape, roughly circular column shape, and mushroom shape), in which a height A in a direction of a light axis (L) is greater than a width C of a bottom surface of the sealing member 108. In addition, a vertical line passing through a center of the light emitting element 105 is referred to as the light axis L in the description of this specification. Due to this configuration, a light emitted from the light emitting element 105 is diffused by the light diffusion material, and an intensity of the light emitted from the light emitting device 100 is roughly proportional to an apparent area ratio of the sealing member 108. As a result, bat-wing shaped light distribution characteristics can be obtained as shown in FIG. 2. That is, a light emitting device 100 in this embodiment shows the light distribution characteristics in which a center part is darker than a periphery part when the light from the light emitting element 105 is viewed from the light axis direction.

An outer shape of the sealing member 108 in a top view is a substantially circular or substantially elliptical shape. Here, in the case of the substantially elliptical shape, a radius B of the bottom surface has a long radius and a short radius, and in this specification, the short radius is defined as the radius B. In the case of the substantially circular shape, the substantially circular bottom surface has a diameter that is defined as the width C of the substantially circular bottom surface of the sealing member 108. In the case of the substantially elliptical shape, the substantially ellipsoidal bottom surface has a length of a short axis that is defined as the width C of the substantially circular bottom surface of the sealing member 108 (the width C is equal to the radius B+the radius B).

FIG. 2 is a view showing the light distribution characteristics of the light emitting device in this embodiment. As shown in FIG. 2, the light emitting device in this embodiment has the bat-wing shaped light distribution characteristics in which a relative light intensity is higher at a light distribution angle of 50° to 60° than at an angle of 0° and a light distribution is wider.

FIG. 2 shows cases where aspect ratios (A/B) which are provided by dividing the height A of the sealing member in the light axis direction by the radius B of the bottom surface of the sealing member are 2.8, 3.2, and 3.5. It is found that as the aspect ratio is increased, the relative light intensity is decreased at around 0° and the light distribution becomes wide. In order to uniformly diffuse the light, the aspect ratio is favorably 2.0 or more.

The light emitting element 105 is directly covered with the sealing member 108, so that Fresnel loss can be reduced and light extraction efficiency can be improved, compared with a case where a secondary lens is used.

Furthermore, the light emitting element 105 is favorably disposed at a height of 0.5 mm or less from an upper surface of the base member.

Furthermore, according to the light emitting device 100, in this embodiment, as a concentration of the light diffusion material is increased, the center part shows a darker brightness distribution than the periphery part when the light from the light emitting element 105 is viewed from the light axis direction.

This is because a light path length in the light axis direction is longer than a light path length in a direction vertical to the light axis when viewed from the light emitting element 105, the light from the light emitting element 105 is scattered and attenuated.

Therefore, by adjusting the concentration of the light diffusion material, a light amount in the light axis direction is reduced to provide the bat-wing shaped light distribution without increasing the aspect ratio so much. Thus, a resin amount can be reduced, and productivity is improved.

Hereinafter, a preferable embodiment of the light emitting device 100 in this embodiment will be described.

Base Member 101

The base member 101 is the member on which the light emitting element 105 is mounted. The conductor wiring 102 for supplying a power to the light emitting element 105 is formed on the surface of the base member 101.

The base member 101 is made of ceramics, or a resin such as a phenol resin, an epoxy resin, a polyimide resin, a BT resin, a polyphthalamide (PPA) resin, and a polyethylene terephthalate (PET) resin. Among them, in view of low cost and high moldability, an insulating resin is favorably used. Alternatively, in order to provide the light emitting device superior in heat resistance and light resistance, the base member 101 is favorably made of ceramics.

The ceramics favorably contains alumina, mullite, forsterite, glass ceramics, nitride series (such as AlN), or carbide series (such as SiC). Among them, the ceramics mainly containing alumina or containing alumina as a main component is preferable.

In addition, in the case where the base member 101 is made of a resin, a glass fiber or an inorganic filler of $SiO_2$, $TiO_2$, $Al_2O_3$ may be mixed in the resin in order to improve mechanical strength, to reduce thermal expansion, and to improve light reflectivity. Furthermore, the base member 101 only have to insulate and isolate the pair of conductor wirings 102 from each other, and a metal substrate in which an insulating layer is formed on a metal member may be used.

Conductor Wiring 102

The conductor wiring 102 is electrically connected to an electrode of the light emitting element 105 and is used for externally supplying a current (power). That is, the conductor wiring 102 serves as an electrode for externally applying a current or partially serves as the electrode. In general, the conductor wiring 102 is composed of at least two separate positive and negative parts.

The conductor wiring 102 is formed at least on the upper surface of the base member on which the light emitting element 105 is mounted. The conductor wiring 102 is made of material which can be optionally selected, based on the material of the base member 101 and a manufacturing method. For example, in the case where the base member 101 is made of ceramics, the conductor wiring 102 is favorably made of high melting temperature material so as to be endurable against a firing temperature of a ceramic sheet, and a high melting temperature metal such as tungsten or molybdenum is favorably used. In addition, the metal may be covered with another metal such as nickel, gold, or silver, by plating, sputtering, or vapor deposition.

Furthermore, in a case where the base member 101 is made of a glass epoxy resin, the conductor wiring 102 is favorably made of readily-processable material. Furthermore, in a case where the base member 101 is made of an injection molded epoxy resin, the conductor wiring 102 is favorably made of material which can be readily processed by punching, etching, or bending, and has a relatively high mechanical strength. As a specific example, the conductor wiring 102 is composed of a metal of copper, aluminum, gold, silver, tungsten, iron, or nickel, a metal layer of iron-nickel alloy, phosphor bronze, copper-iron alloy, or molybdenum, or lead frame. In addition, its surface may be covered with another metal material. This material is not limited in particular, but includes only silver, or alloy containing silver, copper, gold, aluminum, or rhodium, or a multiple-layer film containing silver and the above alloy. Furthermore, the metal material may be formed by sputtering or vapor deposition other than plating.

Connection Member 103

The connection member 103 is provided to fix the light emitting element 105 to the base member 101 or the conductor wiring 102. The connection member 103 is made of an insulating resin or electrically-conductive material, and in the case of the flip-chip bonding shown in FIG. 1B, the electrically conductive material is used. More specifically, the connection member 103 includes Au alloy, Ag alloy, Pd alloy, In alloy, Pb—Pd alloy, Au—Ga alloy, Au—Sn alloy, Sn alloy, Sn—Cu alloy, Sn—Cu—Ag alloy, Au—Ge alloy, Au—Si alloy, Al alloy, Cu—In alloy, or mixture of metal and flux.

The connection member 103 may be in the form of liquid, paste, solid (in the form of sheet, block, powder, or wire), and the form may be appropriately selected according to a composition and a shape of the base member. Furthermore, the connection member 103 may be composed of a single member or a combined member.

Insulating Member 104

The conductor wiring 102 is favorably covered with the insulating member 104 except for the part to be electrically connected to the light emitting element 105 or another material. That is, as shown in each drawing, a resist may be disposed on the base member to insulate and cover the conductor wiring 102, and the insulating member 104 can serve as the resist.

In the case where the insulating member 104 is disposed, when a white filler is contained similarly to an underfill material as will be described below, the light can be prevented from being leaked or absorbed, in addition to the effect of insulating the conductor wiring 102, so that the light extraction efficiency of the light emitting device 100 can be improved.

The insulating member 104 may be made of any material as long as the material is less likely to absorb the light from the light emitting element and has an insulating property. For example, the material includes an epoxy, silicone resin, a modified-silicone resin, a urethane resin, an oxetane resin, an acrylic resin, a polycarbonate resin, and a polyimide resin.

Light Emitting Element 105

The light emitting element 105 mounted on the base member is not limited in particular, and may be a known element, but in this embodiment, a light emitting diode is favorably used as the light emitting element 105.

The light emitting element 105 may emit any wavelength. For example, the light emitting element for blue light and green light may be made of ZnSe, nitride-based semiconductor ($InAl_yGa_{1-x-y}N$, $0 \leq x$, $0 \leq y$, $x+y \leq 1$), or GaP. Furthermore, the light emitting element for red color may be made of GaAlAs, or AlInGaP. Furthermore, a semiconductor light emitting element made of material other than the above may be used. A composition, a light color, and a size of the light emitting element, and the number of the light emitting elements may be selected according to the purpose.

The light wavelength can be variously selected depending on the material and a degree of mixed crystal of the semiconductor layer. Furthermore, the semiconductor layer may have positive and negative electrodes on the same surface, or may have positive and negative electrodes on different surfaces.

The light emitting element 105 in this embodiment has a light-transmissive substrate, and semiconductor layers stacked on the substrate. The semiconductor layers include an n-type semiconductor layer, an active layer, and a p-type semiconductor layer formed in this order, and an n-type electrode is formed on the n-type semiconductor layer, and a p-type electrode is formed on the p-type semiconductor layer.

As shown in FIG. 1B, the electrode of the light emitting element 105 is flip-chip bonded to the conductor wiring 102 on the surface of the base member 101 through the connection member 103, and a surface opposite to the surface having the electrode, that is, a main surface of the light-transmissive substrate serves as a light extraction surface.

The light emitting element 105 is disposed so as to stride the two insulated and isolated positive and negative conductor wirings 102 and is electrically connected and mechanically fixed thereto through the conductive connection member 103. A method for mounting the light emitting element 105 may use a bump in addition to solder paste. Furthermore, the light emitting element 105 may be a small packaged element in which the light emitting element is sealed with a resin or the like, and its shape and structure is not limited in particular.

In addition, as will be described below, in the case where the light emitting device includes a wavelength conversion member, a nitride semiconductor ($In_xAl_yGa_{1-x-y}N$, $0 \leq x$, $0 \leq y$, $x+y \leq 1$) that can emit a light having a short wavelength which can efficiently energize a wavelength conversion member 109 is favorably adopted.

Underfill 106

In the case where the light emitting element 105 is flip-chip bonded, the underfill 106 is favorably formed between the light emitting element 105 and the base member 101. The underfill 106 contains a filler so that the light from the light emitting element 105 can be efficiently reflected, and a thermal expansion rate can be made to approach a thermal expansion rate of the light emitting element 105.

The material of the underfill 106 is not limited in particular as long as it is less likely to absorb the light from the light emitting element. For example, the material includes an epoxy resin, a silicone resin, a modified-silicone resin, a urethane resin, an oxetane resin, an acrylic material, a polycarbonate resin, and a polyimide resin.

When the underfill 106 contains the white filler, the light is more likely to be reflected, and the light extraction efficiency can be improved. Furthermore, the filler is favorably an inorganic compound. Here, the "white filler" includes a case where it looks white when scattered due to a difference in refractive index from a material around the filler even when the filler is transparent itself.

Here, reflectivity of the filler is favorably 50% or more with respect to the emitted light, and more favorably 70% or more. Thus, the light extraction efficiency of the light emitting device 100 can be improved. Furthermore, a grain diameter of the filler is favorably between 1 nm and 10 nm. When the grain diameter of the filler falls within this range, fluidity of the resin as the underfill can be improved, and a small space can be surely covered. In addition, the grain diameter of the filler is favorably between 100 nm and 5 μm, and more favorably between 200 nm and 2 μm. A shape of the filler may be a spherical shape or scale-like shape.

In addition, a side surface of the light emitting element is favorably prevented from being covered with the underfill by appropriately selecting and adjusting the grain diameter of the filler and the material of the underfill. This is because the side surface of the light emitting element is to be ensured as a light extraction surface.

Sealing Member 108

The sealing member 108 is disposed on the base member so as to cover the light emitting element 105 to protect the light emitting element 105 from an exterior environment, and to optically control the light emitted from the light emitting element. In this embodiment, the light emitting element 105 is directly covered with the sealing member 108.

The sealing member 108 may be made of an epoxy resin, a silicone resin, a mixed resin of these, or light-transmissive material such as glass. Among them, in view of light resistance and moldability, the silicone resin is favorably selected.

The sealing member 108 contains the light diffusion material to diffuse the light from the light emitting element 105. When the light diffusion material is contained, the light emitted from the light emitting element 105 in the direction of the light axis L is diffused in whole directions by the light diffusion material.

In addition, the sealing member 108 may contain, in addition to the light diffusion material, a wavelength conversion member such as a phosphor which absorbs the light from the light emitting element 105 and emits a light having a wavelength different from the light emitted from the light emitting element 105, and a coloring agent in accordance with a light color emitted from the light emitting element 105.

The sealing member 108 can be formed by compression molding or injection molding to cover the light emitting element 105. Alternatively, the sealing member 108 may be formed into a shape shown in each drawing by optimizing viscosity of the material of the sealing member 108 and dropping or drawing the material on the light emitting element 105 with a surface tension of the material itself.

When the sealing member 108 is formed by the latter method, the sealing member can be formed by a simpler method without needing a mold. In addition, when the viscosity of the material of the sealing member is adjusted in the above method, the desired viscosity can be obtained by use of the light diffusion material, the wavelength conversion member, and the coloring agent described above in addition to the viscosity of the material itself.

Light Diffusion Material

The light diffusion material includes an oxide such as $SiO_2$, $Al_2O_3$, $Al(OH)_3$, $MgCO_3$, $TiO_2$, $ZrO_2$, $ZnO$, $Nb_2O_5$, $MgO$, $Mg(OH)_2$, $SrO$, $In_2O_3$, $TaO_2$, $HfO$, $SeO$, $Y_2O_3$, $CaO$, $Na_2O$, $B_2O_3$, a nitride such as $SiN$, $AlN$, and $AlON$, and a fluoride such as $MgF_2$. These may be used alone or may be mixed. Alternatively, they may be stacked as multiple layers.

Furthermore, an organic filler may be used as the light diffusion material. For example, various particulate resins may be used. In this case, the various resins include a silicone resin, a polycarbonate resin, a polyether sulfone resin, a polyalirate resin, a polytetrafluoroethylene resin, an epoxy resin, a cyanate resin, a phenol resin, an acrylic resin, a polyimide resin, a polystyrene resin, a polypropylene resin, a polyvinyl acetal resin, a polymethylmethacrylate resin, a urethane resin, and a polyester resin.

It is favorable that the light diffusion material substantially does not convert the wavelength of the light from the light emitting element. Thus, it is possible to prevent color unevenness in the distributed light which is caused because a thickness of the layer containing the wavelength conversion member varies depending on an angle.

A content amount of the light diffusion material is to be selected so that the light can be diffused, such as 0.01 wt. % to 30 wt. %, and favorably 2 wt. % to 20 wt. %. In addition, a size of the light diffusion material is also selected so that the light can be diffused, such as 0.01 μm to 30 μm, and favorably 0.5 μm to 10 μm. In addition, its shape may be a spherical shape or scale-like shape, but in order to uniformly diffuse the light, it is favorably the spherical shape. Here, the concentration of the light diffusion material varies relatively according to a difference in refractive index from the sealing member and a thickness of the sealing member, so that the above values are just the roughly estimated values.

For example, the light emitting element itself generally has the strongest intensity in the light axis direction. Therefore, when the concentration of the light diffusion material is too low, the brightness distribution cannot be darker in the center part than the periphery part when the light from the light emitting element is viewed from the light axis direction. Thus, the concentration of the diffusion material is favorably adjusted so that the center part has the brightness distribution darker than the periphery part.

Furthermore, by controlling the concentration of the light diffusion material in the sealing member 108, the center part can be darker and the periphery part can be brighter when the light emitting device 100 is viewed in the light axis direction. Due to this configuration, by further controlling the light amount in the light axis direction, the bat-wing shaped light distribution characteristics can be obtained.

Figure 6:
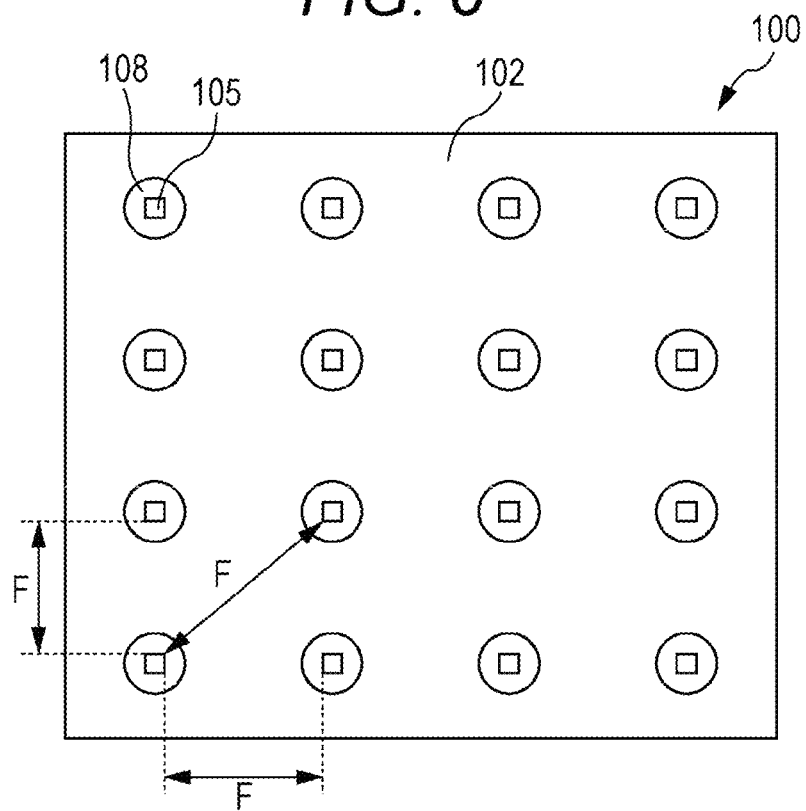
FIG. 6 is a top view showing one example of a light emitting device in an embodiment.

According to the light emitting device in this embodiment, the light distribution can be widened without using a secondary lens, so that in a case where the plurality of the light emitting elements 105 are disposed on the base member 101, the light can be uniformly diffused in a short radiation distance even when a distance between the adjacent light emitting elements is 20 mm or more. Thus, with the plurality of light emitting elements, the brightness unevenness can be prevented in a surface light source. Here, the distance between the adjacent light emitting elements means a shortest distance between the adjacent light emitting elements 105 as shown by a distance F in FIG. 6.

Second Embodiment

Figure 3:
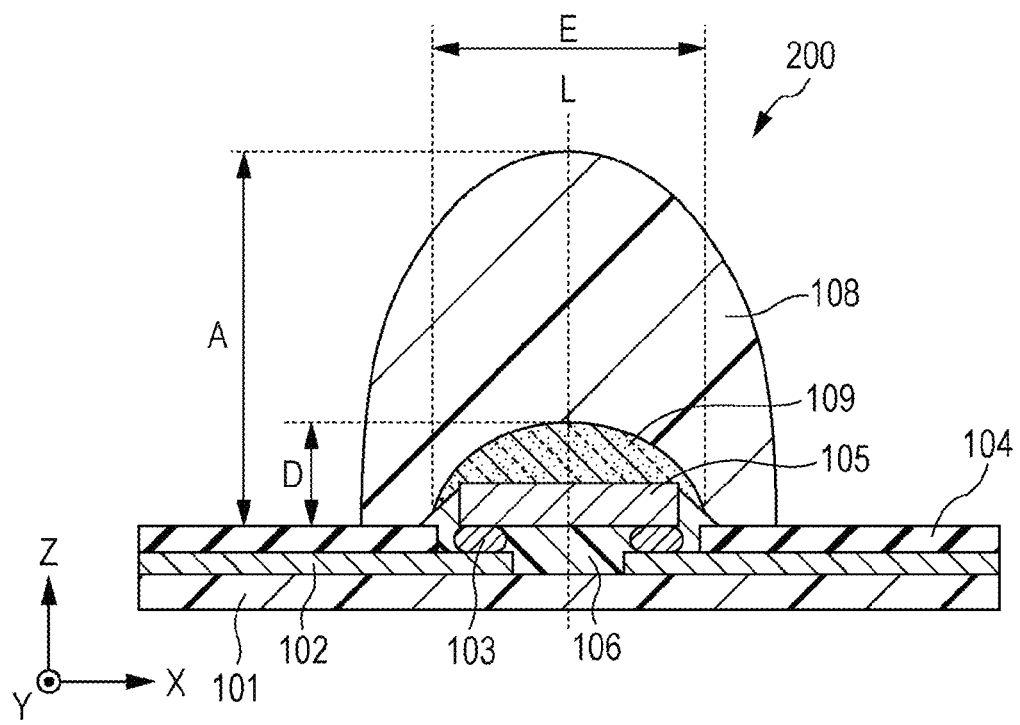
FIG. 3 is a cross-sectional view showing one example of a light emitting device in an embodiment.

FIG. 3 is a cross-sectional view showing one example of a light emitting device in the second embodiment.

According to this embodiment, a wavelength conversion member 109 is disposed so as to be in contact with a light emitting element 105, and a sealing member 108 containing a light diffusion material is formed so as to cover the wavelength conversion member 109.

As described above, in the case where the sealing member 108 contains the wavelength conversion member as a whole, the color unevenness in distributed light is caused because the thickness of the layer containing the wavelength conversion member varies depending on the angle. Therefore, according to this embodiment, the wavelength conversion member 109 is formed around the light emitting element 105, and the sealing member 108 having optical performance is formed over the wavelength conversion member 109. In this way, it becomes possible to separately form the region in which the wavelength is converted (wavelength conversion member 109), and the region in which the optical performance is applied (sealing member 108), so that while the desired light distribution characteristic can be obtained, the color unevenness in distributed light is suppressed.

Wavelength Conversion Member 109

The wavelength conversion member absorbs the light from the light emitting element having a light emitting layer made of nitride-based semiconductor, and converts a wavelength of the light to a different wavelength. A phosphor material may include a nitride-based phosphor and an oxynitride-based phosphor which are mainly activated with lanthanoid such as Eu or Ce. More specifically, it is favorably at least one selected from the following elements roughly classified in (D1) to (D3).

(D1) Phosphors such as alkaline earth halogen apatite, alkaline earth metal halogen borate, alkaline earth metal aluminate, alkaline earth metal sulfide, alkaline earth metal thiogallate, alkaline earth metal silicon nitride, and germinate which are mainly activated with a lanthanoid such as Eu or a transition metal such as Mn.

(D2) Phosphors such as rare earth aluminate, rare earth silicate, and alkaline earth metal rare earth silicate which are mainly activated with a lanthanoid such as Ce.

(D3) Phosphors such as organic or organic complex which are mainly activated with a lanthanoid such as Eu.

Among them, a favorable phosphor is a yttrium aluminum garnet (YAG) phosphor which is a rare earth aluminate phosphor mainly activated with a lanthanoid such as Ce shown in (D2). The YAG phosphor is expressed by composition formulas shown in the following (D21) to (D24).

$$Y_3Al_5O_{12}:Ce \tag{D21}$$

$$(Y_{0.8}Gd_{0.2})_3Al_5O_{12}:Ce \tag{D22}$$

$$Y_3(Al_{0.8}Ga_{0.2})_5O_{12}:Ce \tag{D23}$$

$$(Y,Gd)_3(Al,Ga)_5O_{12}:Ce \tag{D24}$$

In addition, Y may be partially or totally replaced with Tb or Lu. More specifically, $Tb_3Al_5O_{12}:Ce$ or $Lu_3Al_5O_{12}:Ce$ may be used. Furthermore, other than the above-described phosphors, a phosphor having the same performance, action, and effect can be used.

A grain diameter of the above phosphor is favorably 2.5 μm to 30 μm.

In addition, the "grain diameter" in this specification means an average grain diameter, and its value is obtained by an air permeability method or fisher-subsieve-sizers-No. (F. S. S. No.) (value expressed by D bar (bar above D)).

The wavelength conversion member may be made of light emitting material called nanocrystal or quantum dot. This material includes semiconductor materials such as group II-VI, group III-V, group IV-VI, and group semiconductors. More specifically, it may be a nanosized high dispersion particles of CdSe, core-shell $CdS_xSe_{1-x}/ZnS$, GaP, InAs, InP, GaN, PbS, PbSe, Cu (In, Ga)$S_2$, or Ag (In, Ga)$S_2$. This quantum dot has a grain diameter of 1 nm to 100 nm, and favorably 1 nm to 20 nm (having 10 to 50 atoms). With the quantum dots having the above grain diameter, internal scattering can be prevented, so that the light can be prevented from scattering in the wavelength conversion region.

A light emitting device 200 shown in FIG. 3 may have the same configuration as the light emitting device 100 in the first embodiment except that the wavelength conversion member 109 is provided around the light emitting element 105.

According to this embodiment, the wavelength conversion member 109 has a project shape in the direction of the light axis L similar to the sealing member 108. The wavelength conversion member 109 is disposed so as to be in contact with the exposed surface of the light emitting element 105 so that the wavelength is converted between the light emitting element and the sealing member 108. According to the example shown in FIG. 3, the wavelength conversion member 109 is formed into a roughly semi-spherical shape to cover the light emitting element 105.

An outer shape of the wavelength conversion member 109 is favorably formed into a circular or ellipsoidal shape when viewed from the top.

A height (D) of the wavelength conversion member 109 in the direction of the light axis (L) is favorably ½ or less of a height (A) of the sealing member 108 in the direction of the light axis (L). Thus, a thickness of the sealing member 108 can be ensured, so that color unevenness can be reduced.

Furthermore, a width (E) of the wavelength conversion member 109 is preferably ⅘ or less of a width (C) of the sealing member 108. Thus, the thickness of the sealing member 108 can be ensured, so that color unevenness can be reduced. Here, the wavelength conversion member 109 has a maximum length when the wavelength converter 109 is viewed from the light axis direction, and the maximum length of the wavelength conversion member 109 is defined as the width (E) of the wavelength conversion member 109. Therefore, in the case of the substantially circular bottom surface, the maximum length is equal to or less than ⅘ of the diameter of the substantially circular bottom surface. In the case of the substantially ellipsoidal bottom surface, the maximum length is equal to or less than ⅘ of the length of the short axis of the ellipsoidal bottom surface.

In addition, the sealing member 108 of the light emitting device in the second embodiment may contain a wavelength conversion member. In this case, an emitted light wavelength from the wavelength conversion member 109 is favorably longer than an emitted light wavelength from the wavelength conversion member such as a phosphor in the sealing member 108. Thus, the light whose wavelength has been converted by the wavelength conversion member 109 can be prevented from being converted again by the wavelength conversion member contained in the sealing member.

Variation of Second Embodiment

Figure 4:
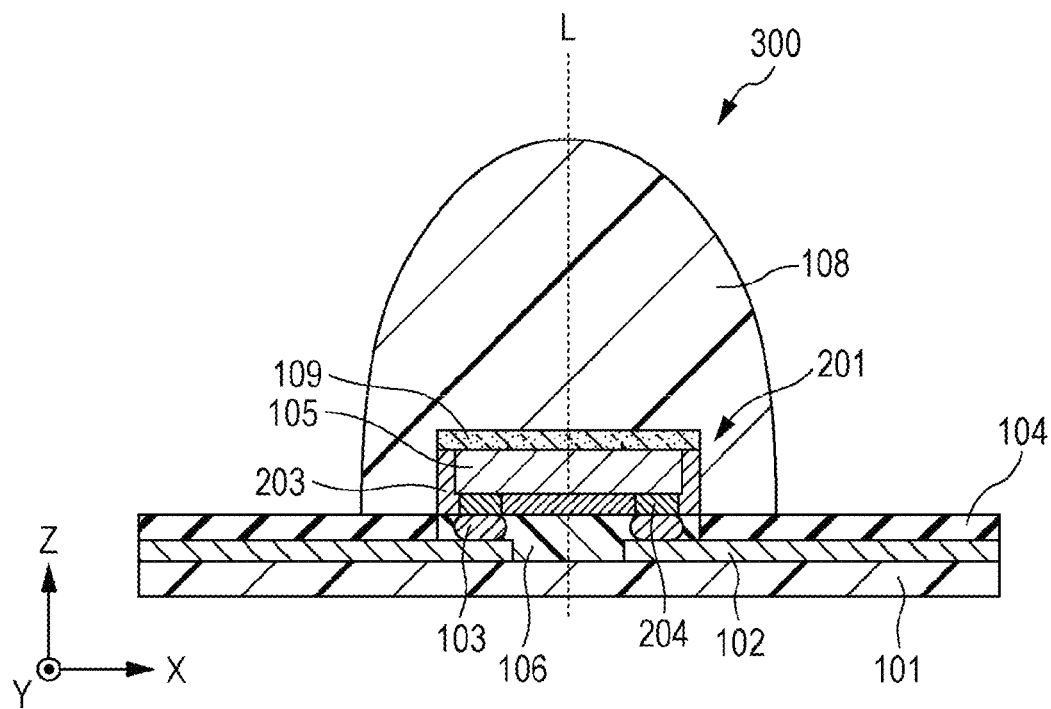
FIG. 4 is a cross-sectional view showing one example of a light emitting device in an embodiment.

FIG. 4 is a cross-sectional view showing the variation of the light emitting device 200 in the second embodiment. A light emitting device 300 in this variation includes a small-type LED package 201 including a wavelength conversion member 109 and a reflection member 203 in a light emitting element 105. More specifically, the LED package 201 includes the reflection member 203 which covers a side surface and a lower surface of the light emitting element 105, and the wavelength conversion member 109 which covers an upper surface of the light emitting element 105, and the LED package 201 is mounted on a base member 101. A terminal 204 of the LED package 201 is electrically connected to a conductor wiring 102 though a connection member 103.

In this variation also, similar to the second embodiment, a region in which wavelength conversion is performed and a region having optical performance can be separately formed, so that color unevenness in the distributed light can be prevented. Due to this configuration, a light source in which chromaticity has been already selected can be used, so that a product yield regarding chromaticity can be improved.

Third Embodiment

Figure 5:
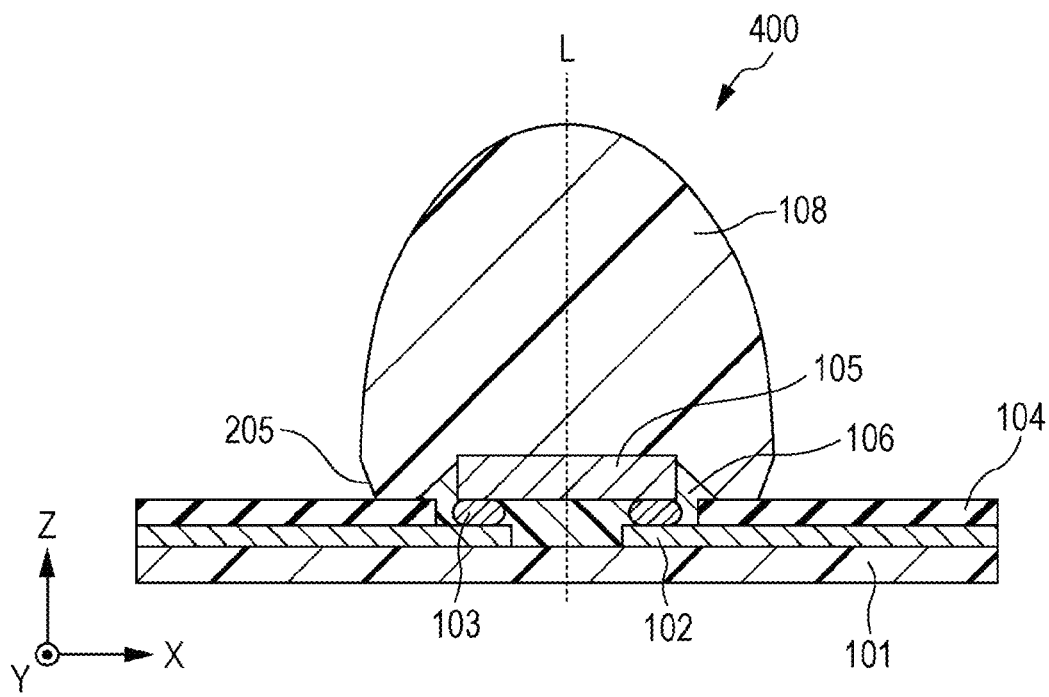
FIG. 5 is a cross-sectional view showing one example of a light emitting device in an embodiment.

FIG. 5 is a cross-sectional view showing one example of a light emitting device 400 in the third embodiment.

According to this embodiment, a sealing member 108 is formed into a shape in which a radius of a region being in contact with a base member 101 (a bottom surface of the sealing member 108) is smaller than a maximum radius of the sealing member 108 in a width direction. The light transmissive sealing member 108 has a maximum length when the light transmissive sealing member 108 is viewed from the light axis direction. In the case of the substantially circular bottom surface, the diameter of the substantially circular bottom surface is smaller than the maximum length of the light transmissive sealing member 108. In the case of the substantially ellipsoidal bottom surface, the light transmissive sealing member 108 has a maximum length in the short axis direction of the substantially ellipsoidal bottom surface when the light transmissive sealing member 108 is viewed from the light axis direction, the length of the short axis of the substantially ellipsoidal bottom surface is smaller than the maximum length in the short axis direction of the substantially ellipsoidal bottom surface. Thus, since the sealing member 108 has a reversely-tapered part 205 in the vicinity of the base member 101, a light emitted from the light emitting element in a direction perpendicular to a light axis (L) changes its direction toward an upper direction of the base member due to refraction, so that a light amount to irradiate a whole surface can be increased without being led to the base member. The light emitting device 400 may have the same configuration as the light emitting device 100 in the first embodiment or the light emitting device 200 in the second embodiment except that the sealing member 108 becomes the reversely-tapered shape in the vicinity of the base member 101.

Hereinafter, examples will be described in detail, but the embodiments of the present invention is not limited to the examples.

Example 1

In this example, as shown in FIGS. 1A and 1B, the base member 101 is made of glass epoxy material, and the conductor wiring has a thickness of 35 μm and made of Cu.

The light emitting element is a nitride-based blue LED having a square shape having one side of 600 μm in a planar view, and a thickness of 150 μm. The insulating member 104 is made of epoxy-based white solder resist. The underfill 106 is made of silicone resin containing 30 wt. % of titanium oxide as a filler, and the lower surface and side surface of the light emitting element 105 are covered with the underfill 106. The sealing member 108 is made of a silicone resin containing 30 wt. % of $SiO_2$ filler as a light diffusion material, and as shown in FIGS. 1A and 1B, and has a roughly long semi-spherical shape and a circular outer shape in a top view. The height A in the light axis direction is 5.5 mm, the radius B of the bottom surface of the sealing member 108 is 1.7 mm, and the aspect ratio (A/B) is 3.2.

Due to this configuration, the light emitted from the light emitting element 105 is diffused by the $SiO_2$ filler serving as the light diffusion material, so that light intensity from the light emitting device 100 is roughly proportional to the apparent area ratio of the sealing member 108. As a result, the light distribution characteristics can be realized as shown in FIG. 2 when the aspect ratio is 3.2. According to this light distribution, the relative light intensity is higher at the angles of 50° to 60° than at the angle of 0°, so that the bat-wing shaped light distribution can be obtained.

Example 2

As shown in FIG. 3, this example is similar to Example 1 except that the sealing member 108 contains the wavelength conversion member 109 and is formed around the light emitting element 105.

The wavelength conversion member 109 in this example is made of a silicone resin containing a YAG-based phosphor, and the sealing member 108 is made of a silicone resin containing a $SiO_2$ filler as the light diffusion material.

Due to this configuration, blue light from the light emitting element 105 is synthesized with yellow light having a wavelength converted by the wavelength conversion member 109, whereby white light is provided, so that the light can be further diffused in the sealing member 108. As a result, the bat-wing shaped light distribution having less color unevenness can be obtained in all directions.

Figure 7A:
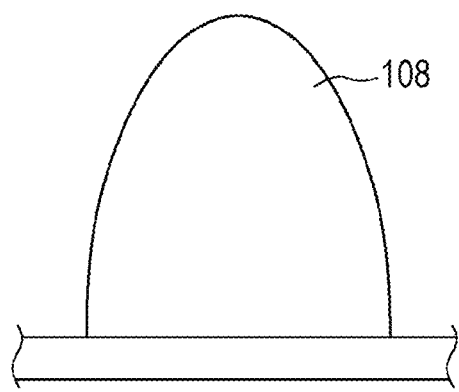
FIGS. 7A to 7C are views showing shapes of sealing members in light emitting devices in Examples 3 to 5, respectively.
Figure 7B:
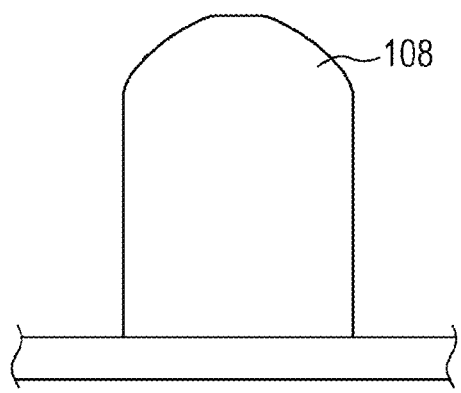
Figure 7C:
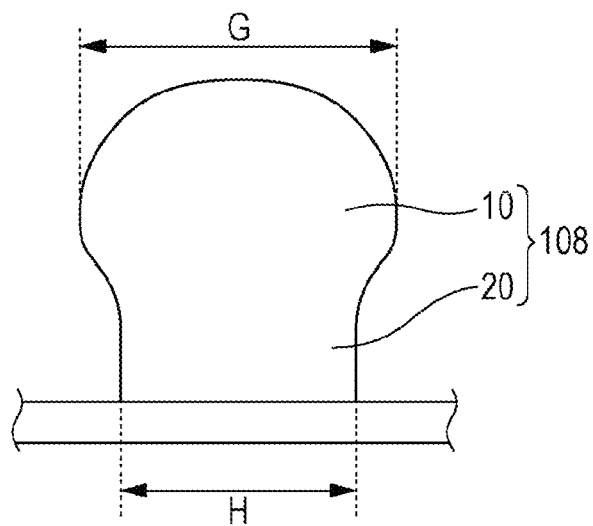

In Examples 3 to 5, the shape of the sealing member 108 is changed, and distribution characteristics and brightness distributions are examined. A light emitting device in Example 3 is shown in FIG. 7A, a light emitting device in Example 4 is shown in FIG. 7B, and a light emitting device in Example 5 is shown in FIG. 7C.

The light emitting devices in Examples 3 to 5 are similar to each other in that a sealing member 108 has the projection shape in which a height in a light axis direction is greater than a width of a bottom surface of the sealing member 108, and contains a light diffusion material, and an upper surface of the sealing member 108 has a curvature.

Furthermore, as similar points, a base member is made of glass epoxy base material, and a conductor wiring has a thickness of 35 μm and made of Cu. In addition, a light emitting element is composed of a nitride-based blue LED having a square shape having one side of 600 μm in a planar view, and a thickness of 150 μm, and an insulating member is made of epoxy-based white solder resist.

Example 3

As shown in FIG. 7A, according to the sealing member 108 in Example 3, the curvature of the upper surface is greater in the vicinity of the light axis than in other parts, and a roughly circular cone shape is provided. A side surface of the sealing member also has a curvature. Namely, a surface of the projection shape has the smallest curvature at the light axis of the light emitting element 105. In Example 3, as shown in FIG. 3, the phosphor layer is formed by applying the phosphor onto the light emitting element. The phosphor is a YAG-based phosphor, and a white light emitting device is provided.

Example 4

As shown in FIG. 7B, according to the sealing member 108 in Example 4, the curvature of the upper surface is smaller in the vicinity of the light axis than in other parts, and the upper surface in the vicinity of the light axis is almost flat. Furthermore, a side surface of the sealing member is almost perpendicular to an upper surface of the base member (or an upper surface of the light emitting element), and a roughly circular column is provided.

This shape can be formed as will be described below.

First, a diffusion material is added to a resin containing a nano filler and having high thixotropy, and the prepared resin is applied with a dispenser moved up in a vertical direction (z direction). Thus, when the dispenser is lifted to a predetermined height, the lifting is stopped, and the resin is supplied until a perpendicular cross-sectional surface is formed into a shape close to a rectangular shape. When a desired shape is formed, the supply of the resin is stopped, and the resin is cut so as to scrape the upper surface. Here, although the upper surface of the sealing member has the curvature in the above example, but the upper surface may be flat.

In Example 4, similar to Example 3, a phosphor layer is formed by applying a phosphor onto the light emitting element, and a white light emitting device is provided.

Example 5

As shown in FIG. 7C, the sealing member 108 in Example 5 includes an upper part 10 and a lower part 20, and has a mushroom shape in which the upper part 10 has a diameter G greater than a diameter H of the lower part 20. Furthermore, a curvature of the upper part 10 in the vicinity of the light axis is smaller than a curvature of other parts, and an upper surface in the vicinity of the light axis has a roughly flat shape similar to Example 4. The lower part 20 is formed into a roughly circular column shape having a surface which is roughly perpendicular to an upper surface of the base member (or an upper surface of the light emitting element), and the upper part 10 is formed into a roughly spherical shape.

Furthermore, as for the side surface of the sealing member, a diameter is gradually increased from a bottom part, reaches the greatest point G, and then is gradually reduced toward the upper surface. Thus, the upper part 10 overlaps with the lower part 20 when the light emitting device is viewed from the top, so that a periphery of the bottom part of the sealing member having the highest brightness cannot be directly seen when viewed from the top, so that uniformity can be improved as will be described below.

In Example 5, a phosphor layer is formed in the LED package 201 shown in FIG. 4, and a white light emitting device is provided.

Light Distribution Characteristics and Brightness Distribution

Figure 8:
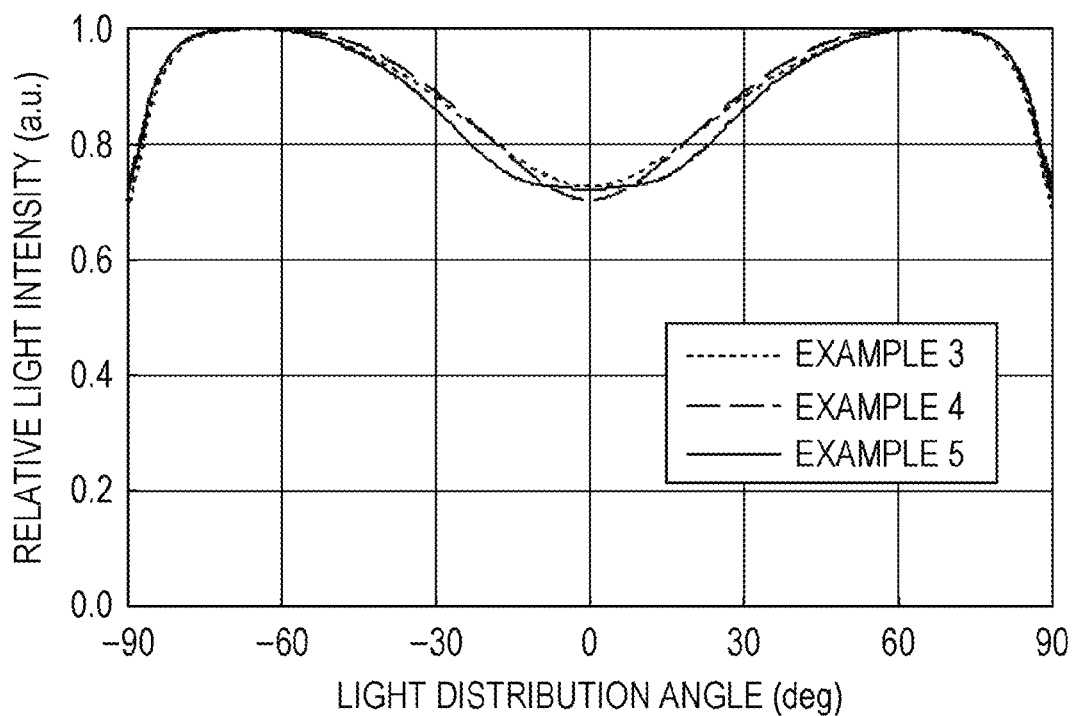
FIG. 8 is a view showing light distribution characteristics of the light emitting devices in Examples 3 to 5.

FIG. 8 shows the light distribution characteristics of all of the light emitting devices having the bat-wing shaped light distributions. The light emitting devices have almost the same light distribution characteristics except that the light emitting device in Example 5 is flat in brightness in the vicinity of the light axis, compared with the light emitting devices in Example 3 and Example 4.

Figure 9:
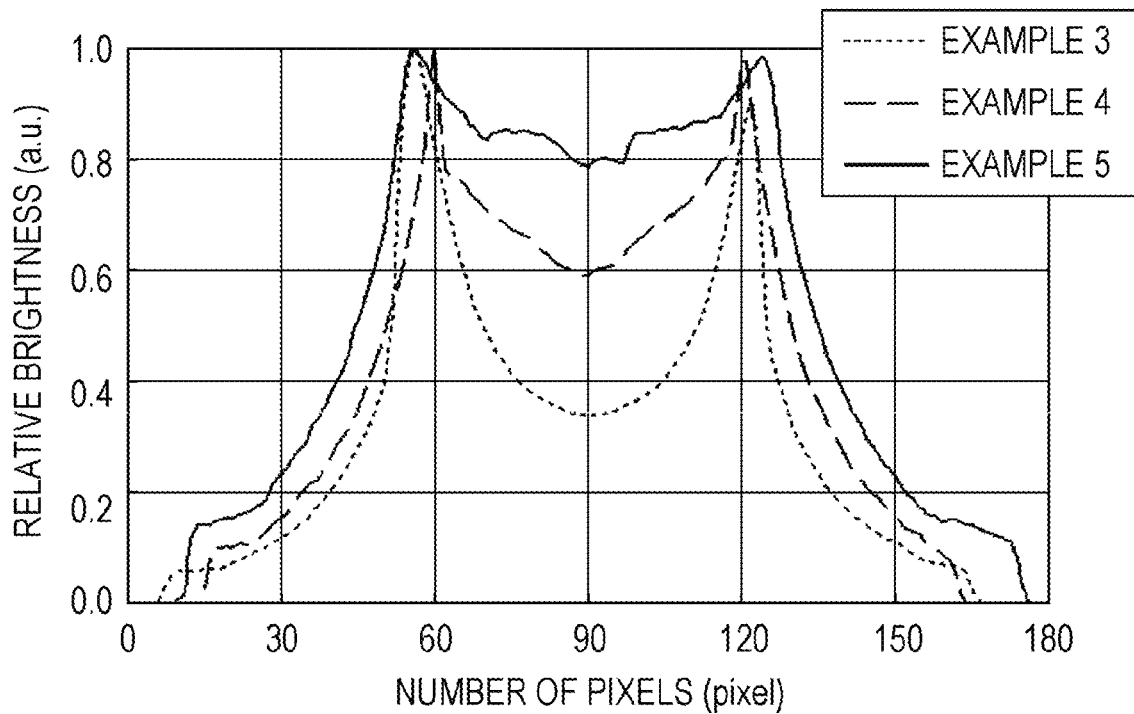
FIG. 9 is a view showing brightness distributions of the light emitting devices in Examples 3 to 5.
Figure 10A:
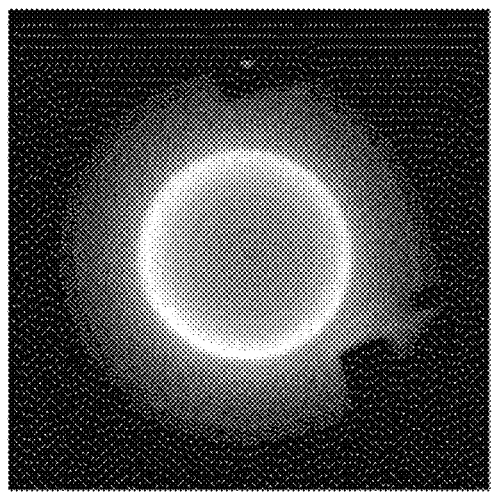
FIGS. 10A to 10C are views of the brightness distributions in Examples 3 to 5, respectively.
Figure 10B:
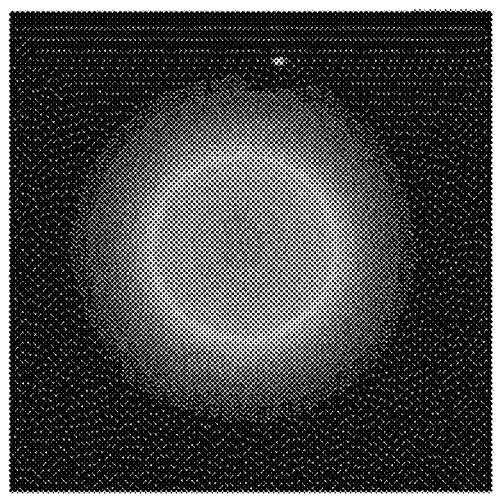
Figure 10C:
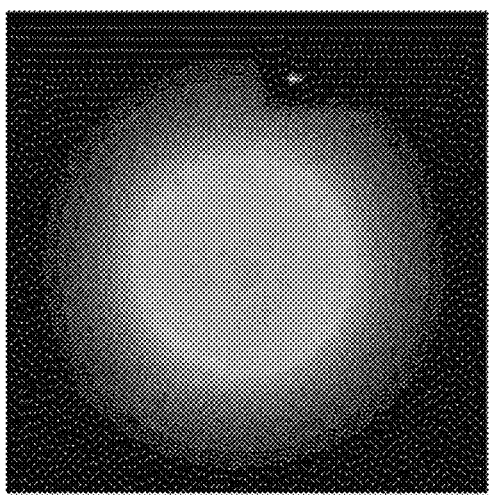

On the other hand, FIG. 9 shows brightness distributions of the sealing members 108 and their vicinities when viewed from the top in the light emitting devices in Examples 3 to 5, and FIGS. 10A to 10C show in-plane brightness distributions when viewed from the top, in which FIGS. 10A, 10B, and 10C show the brightness distributions in Example 3, Example 4, and Example 5, respectively.

From the brightness distributions in FIGS. 9 and 10A to 10C, the light emitting device in Example 5 shows the highest uniformity. Here, the uniformity means a ratio in brightness between a darkest part (dark part) in the vicinity of the light axis, and a brightest part (bright part) (dark part/bright part). When the value is high, the difference between the bright part and the dark part is small, which means that the uniformity is high. In addition, the ratios in brightness in Examples 3, 4, and 5 are 0.157, 0.557, and 0.717, respectively.

In a case where an irradiation surface such as a light diffusion plate is very close to the light emitting device, a brightness distribution of the light emitting device itself appears other than the light distribution characteristics shown in FIG. 8, so that in the light emitting device in Example 3, the irradiation surface has doughnut-shaped bright and dark parts in which a dark part is provided on the light axis, and a bright part is provided in its periphery. Meanwhile, in the light emitting devices in Examples 4 and 5, since the brightness uniformity is high, bright and dark parts can be prevented from being generated in the vicinity of the light axis on the irradiation surface.

From the results of Examples 3 and 4, in the case where the curvature of the upper surface of the sealing member 108 in the vicinity of the light axis is smaller than the curvature in other parts, a difference in light path length between the light axis and its periphery is small in the sealing member, so that a difference in light amount passing through in the light axis direction is small, which improves the uniformity.

Furthermore, the reason why the uniformity is highest in the light emitting device in Example 5 is believed that brightest reflected light from the white solder resist around the bottom part of the sealing member in Example 4 is blocked and scattered by the sealing member itself.

As for the difference in diameter between the upper part 10 and the lower part 20 in this case, the diameter of the upper part 10 is 1.1 times to 2.0 times, and favorably 1.2 times to 1.5 times longer than the diameter of the lower part 20. Furthermore, since this diameter ratio varies depending on the aspect ratio and the light distribution characteristics, it is not limited to the above range.

A light emitting device according to an aspect of the present invention includes a base member having a conductor wiring, a light emitting element mounted on the base member and electrically connected to the conductor wiring, and a light-transmissive sealing member covering the light emitting element, in which the sealing member has a projection shape in which a height in a light axis direction is greater than a width of a bottom surface of the sealing member, and the sealing member contains a light diffusion material.

According to the aspect of the present invention, the light emitting device can realize a bat-wing shaped light distribution in which color unevenness in distributed light is improved without using a secondary lens.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a base having a mounting surface with a conductor wiring;
   at least one LED package, each of the at least one LED package comprising:
   a light emitting element mounted on the mounting surface of the base and electrically connected to the conductor wiring, the light emitting element having a light axis direction substantially perpendicular to the mounting surface, the light emitting element having a lower surface facing the base, an upper surface opposite to the lower surface, and a side surface connecting the lower surface and the upper surface;
   a wavelength converter provided on the upper surface of the light emitting element; and
   a reflection member provided directly on the side surface of the light emitting element to cover the side surface and the lower surface of the light emitting element; and
   at least one light transmissive sealing member, each of the at least one light transmissive sealing member including a light diffusion material and covering the wavelength converter and the reflection member of each of the at least one LED package, each of the at least one light transmissive sealing member having a projection shape with a substantially circular bottom surface facing the base and with a height in the light axis direction of the light emitting element.

2. The light emitting device according to claim 1, wherein the light emitting element is disposed at a height position of 0.5 mm or less from the base.

3. The light emitting device according to claim 1,
   wherein the at least one LED package includes a plurality of LED packages,
   wherein a distance between adjacent LED packages among the plurality of the LED packages is equal to or more than 20 mm.

4. The light emitting device according to claim 1, wherein a height of the wavelength converter in the light axis direction is equal or less than ½ of a height of the projection shape.

5. The light emitting device according to claim 1,
   wherein the wavelength converter has a maximum length when the wavelength converter is viewed from the light axis direction,
   and wherein the maximum length is equal to or less than ⅘ of a diameter of the substantially circular bottom surface.

6. The light emitting device according to claim 1, wherein a surface of the projection shape has the smallest curvature at the light axis of the light emitting element.

7. The light emitting device according to claim 1, wherein the conductor wiring has a connection electrically connected to the light emitting element, and a remaining part other than the connection, the remaining part being covered with an insulating member.

8. The light emitting device according to claim 7,
   wherein the insulating member contains:
   a white filler; and
   a material including at least one of an epoxy, silicone resin, a modified-silicone resin, a urethane resin, an oxetane resin, an acrylic resin, a polycarbonate resin, or a polyimide resin.

9. The light emitting device according to claim 8,
   wherein an underfill is formed under the lower surface of the light emitting element and the base, and
   wherein the underfill contains an additional white filler that is substantially same material as the white filler.

10. The light emitting device according to claim 1,
    wherein the height is greater than a diameter of the substantially circular bottom surface,
    wherein each of the at least one light transmissive sealing member has an outermost substantially circular periphery viewed in the light axis direction,
    wherein the outermost substantially circular periphery has a maximum diameter that is larger than the diameter of the substantially circular bottom surface, and
    wherein the outermost substantially circular periphery is apart from a periphery of the substantially circular bottom surface in the light axis direction.

11. The light emitting device according to claim 1, wherein an aspect ratio provided by dividing the height by a radius of the substantially circular bottom surface is equal to or higher than 2.0.

12. The light emitting device according to claim 1, wherein the light emitting device has a light distribution characteristic in which a center part is darker than a periphery part when light from the light emitting element is viewed in the light axis direction.

13. The light emitting device according to claim 1, wherein the light emitting device has a brightness distribution in which the center part is darker than the periphery part when light from the light emitting element is viewed in the light axis direction.

14. A light emitting device comprising:
   a base having a mounting surface with a conductor wiring;
   at least one LED package, each of the at least one LED package comprising:
      a light emitting element mounted on the mounting surface of the base and electrically connected to the conductor wiring, the light emitting element having a light axis direction substantially perpendicular to the mounting surface, the light emitting element having a lower surface facing the base, an upper surface opposite to the lower surface, and a side surface connecting the lower surface and the upper surface;
      a wavelength converter provided on the upper surface of light emitting element; and
      a reflection member provided directly on the side surface of the light emitting element to cover the side surface and the lower surface of the light emitting element; and
   at least one light transmissive sealing member, each of the at least one light transmissive sealing member including a light diffusion material and covering the wavelength converter and the reflection member of each of the at least one LED package, each of the at least one light transmissive sealing member having a projection shape with an ellipsoidal bottom surface facing the base and with a height in the light axis direction of the light emitting element.

15. The light emitting device according to claim 14,
   wherein the at least one LED package includes a plurality of LED packages,
   wherein a distance between adjacent LED packages among the plurality of the LED packages is equal to or more than 20 mm.

16. The light emitting device according to claim 14, wherein a height of the wavelength converter in the light axis direction is equal or less than ½ of a height of the projection shape.

17. The light emitting device according to claim 14, wherein the conductor wiring has a connection electrically connected to the light emitting element, and a remaining part other than the connection, the remaining part being covered with an insulating member.

18. The light emitting device according to claim 14,
   wherein the insulating member contains:
      a white filler; and
      a material including at least one of an epoxy, silicone resin, a modified-silicone resin, a urethane resin, an oxetane resin, an acrylic resin, a polycarbonate resin, or a polyimide resin.

19. The light emitting device according to claim 18,
   wherein an underfill is formed under the lower surface of the light emitting element and the base, and
   wherein the underfill contains an additional white filler that is substantially same material as the white filler.

20. The light emitting device according to claim 14,
   wherein the height is greater than a length of a short axis of the ellipsoidal bottom surface,
   wherein each of the at least one light transmissive sealing member has an outermost periphery viewed in the light axis direction,
   wherein the outermost periphery is apart from a periphery of the ellipsoidal bottom surface in the light axis direction and has a maximum length in a short axis direction of the ellipsoidal bottom surface, and
   wherein the length of the short axis of the ellipsoidal bottom surface is smaller than the maximum length.

* * * * *